United States Patent
Watanabe et al.

(10) Patent No.: US 9,153,935 B2
(45) Date of Patent: Oct. 6, 2015

(54) ELECTRONIC UNIT, OPTCAL DISK KNIT, DISPLAY UNIT, AND IMAGE PICKUP UNIT

(71) Applicant: Sony Corporation, Tokyo (JP)

(72) Inventors: Yoshiaki Watanabe, Kanagawa (JP); Takayuki Kawasumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/327,854

(22) Filed: Jul. 10, 2014

(65) Prior Publication Data
US 2015/0024221 A1   Jan. 22, 2015

(30) Foreign Application Priority Data
Jul. 16, 2013 (JP) ................. 2013-147743

(51) Int. Cl.
| | |
|---|---|
| H01L 23/29 | (2006.01) |
| H01L 31/0216 | (2014.01) |
| H01S 5/028 | (2006.01) |
| G11B 7/12 | (2012.01) |
| H01L 51/52 | (2006.01) |
| H04N 5/369 | (2011.01) |

(52) U.S. Cl.
CPC .............. *H01S 5/028* (2013.01); *G11B 7/1201* (2013.01); *H01L 23/291* (2013.01); *H01L 31/0216* (2013.01); *H01L 51/5253* (2013.01); *H01S 5/0282* (2013.01); *H01S 5/0283* (2013.01); *H04N 5/369* (2013.01)

(58) Field of Classification Search
CPC . H01L 23/291; H01L 31/0216; H01S 5/0282; H01S 5/0283
See application file for complete search history.

(56) References Cited

U.S. PATENT DOCUMENTS

| | | | | |
|---|---|---|---|---|
| 4,980,203 A | * | 12/1990 | Dabosi et al. ................ | 427/252 |
| 5,996,212 A | * | 12/1999 | Knapen .................... | 29/603.07 |
| 6,465,726 B2 | * | 10/2002 | Yamada et al. .............. | 136/251 |
| 6,495,251 B1 | * | 12/2002 | Arbab et al. ................. | 428/336 |
| 6,878,243 B2 | * | 4/2005 | Breme .................... | 204/192.23 |
| 7,303,940 B2 | * | 12/2007 | Eder et al. ...................... | 438/99 |
| 7,368,746 B2 | * | 5/2008 | Fukui et al. .................. | 250/581 |
| 8,277,877 B1 | * | 10/2012 | Dimitrov et al. .............. | 427/162 |

FOREIGN PATENT DOCUMENTS

| | | |
|---|---|---|
| JP | 2003-332032 | 11/2003 |
| JP | 2006-041403 | 2/2006 |
| JP | 2007-189097 | 7/2007 |
| JP | 2007-324193 | 12/2007 |
| JP | 2011-060932 | 3/2011 |

\* cited by examiner

*Primary Examiner* — Evan Pert
(74) *Attorney, Agent, or Firm* — Dentons US LLP (57) ABSTRACT

An electronic unit includes: an electronic device; and a protective film including an aluminum oxide layer and silicon oxide, the aluminum oxide layer with which the electronic device is covered, and the silicon oxide being scattered on a surface of the aluminum oxide layer.

11 Claims, 9 Drawing Sheets

ELECTRONIC UNIT, OPTCAL DISK KNIT, DISPLAY UNIT, AND IMAGE PICKUP UNIT

CROSS REFERENCE TO RELATED APPLICATIONS

This application claims the benefit of Japanese Priority Patent Application JP 2013-147743 filed Jul. 16, 2013, the entire contents which are incorporated herein by reference.

BACKGROUND

The present disclosure relates to an electronic unit, an optical disk unit, a display unit, and an image pickup unit each of which includes a protective film.

In recent years, various kinds of laser diode devices (semiconductor light-emitting devices) have been widely used as light sources for optical disk recording and reproduction units. Recently, as light sources for next-generation high-density optical disks with high recording density, demand for blue-violet laser diode devices using a Group III-V nitride semiconductor such as gallium nitride (GaN) has been increased.

A protective film made of an oxide is formed on a resonator end surface of each of these laser diode devices to prevent entry of water from outside and to prevent deterioration of and damage to the laser diode devices. For such a protective film, $SiO_2$, SiN, AlO, AlN, and the like are used (for example, refer to Japanese Unexamined Patent Application Publication Nos. 2011-060932, 2007-324193, 2003-332032, 2006-041403, and 2007-189097).

SUMMARY

In the above-described materials used for the protective film, $SiO_2$ is superior in water resistance. However, since $SiO_2$ has low thermal conductivity, it is difficult for $SiO_2$ to efficiently dissipate heat during an operation in the laser diode device. Moreover, compared to oxides, film stress of nitrides such as SiN and AlN is more likely to increase during film formation, and it is difficult for the nitrides to maintain stable film formation conditions. Further, in a case where nitride saturation is insufficient, the nitrides may absorb light of a specific wavelength. Furthermore, polycrystallization of AlO may be accelerated by water from outside or water contained in AlO to cause a change in volume of a film or a change in optical performance such as refractive index.

Therefore, for example, as described in Japanese Unexamined Patent Application Publication No. 2011-060932, a method in which water-resistant $SiO_2$ is further formed on AlO with which the resonator end surface is covered is considered. However, in this case, water contained in AlO is not released to outside, and water is localized in AlO; therefore, it is difficult to eliminate a possibility that deterioration caused by polycrystallization occurs. Therefore, a protective film that has high thermal conductivity and is less likely to be deteriorated by water is desired.

It is desirable to provide an electronic unit, an optical disk unit, a display unit, and an image pickup unit each of which includes a protective film with high heat dissipation and high reliability.

According to an embodiment of the present disclosure, there is provided an electronic unit including: an electronic device; and a protective film including an aluminum oxide layer and silicon oxide, the aluminum oxide layer with which the electronic device is covered, and the silicon oxide being scattered on a surface of the aluminum oxide layer.

According to an embodiment of the present disclosure, there is provided an optical disk unit including: an optical disk having a recording surface; a light source configured to apply irradiation light to the recording surface of the optical disk; a photodetector configured to detect reflected light from the recording surface of the optical disk; and a control section configured to control operations of the optical disk, the light source, and the photodetector, in which the light source includes a semiconductor light-emitting device having a resonator end surface configured to emit the irradiation light, and a protective film including an aluminum oxide layer and silicon oxide, the aluminum oxide layer with which the resonator end surface of the semiconductor light-emitting device is covered, and the silicon oxide being scattered on a surface of the aluminum oxide layer.

According to an embodiment of the present disclosure, there is provided a display unit including: a pair of substrates; an organic light-emitting device sandwiched between the pair of substrates, and including a first electrode, an organic layer, and a second electrode in order; and a protective film including an aluminum oxide layer and silicon oxide, the aluminum oxide layer with which an end section of the organic light-emitting device is covered, and the silicon oxide being scattered on a surface of the aluminum oxide layer.

According to an embodiment of the present disclosure, there is provided an image pickup unit including: an image pickup device including a light reception section and a light-condensing section, the light reception section including a photoelectric conversion device, and the light-condensing section being configured to condense incident light onto the light reception section; and a protective film including an aluminum oxide layer and silicon oxide, the aluminum oxide layer with which the image pickup device is covered, and the silicon oxide being scattered on a surface of the aluminum oxide layer.

In the electronic unit, the optical disk unit, the display unit, and the image pickup unit according to the embodiments of the present disclosure, the silicon oxide is scattered on the surface of the aluminum oxide layer with which the electronic device is covered; therefore, while entry of water into the aluminum oxide layer is prevented, water contained in the aluminum oxide layer is released to outside. Moreover, thermal conductivity of the aluminum oxide layer is high, and heat is efficiently dissipated from gaps between places where the silicon oxide is scattered to outside.

In the electronic unit, the optical disk unit, the display unit, and the image pickup unit according to the embodiments of the present disclosure, the protective film with high heat dissipation and less deterioration in configuration and performance is included; therefore, high operation performance is allowed to be stably provided for a long period.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

DETAILED DESCRIPTION

Some embodiments of the present disclosure will be described in detail below referring to the accompanying drawings. It is to be noted that description will be given in the following order.

1. First Embodiment

Light-emitting unit in which a protective film is provided on a resonator end surface of a semiconductor light-emitting device 2. Second Embodiment Optical disk unit including a light source in which a protective film is provided on a resonator end surface of a semiconductor light-emitting device 3. Third Embodiment Display unit including an organic light-emitting device covered with a protective film 4. Fourth Embodiment Image pickup device covered with a protective film and image pickup unit including the image pickup device First Embodiment

[Configuration of Light-Emitting Unit]

Figure 1:
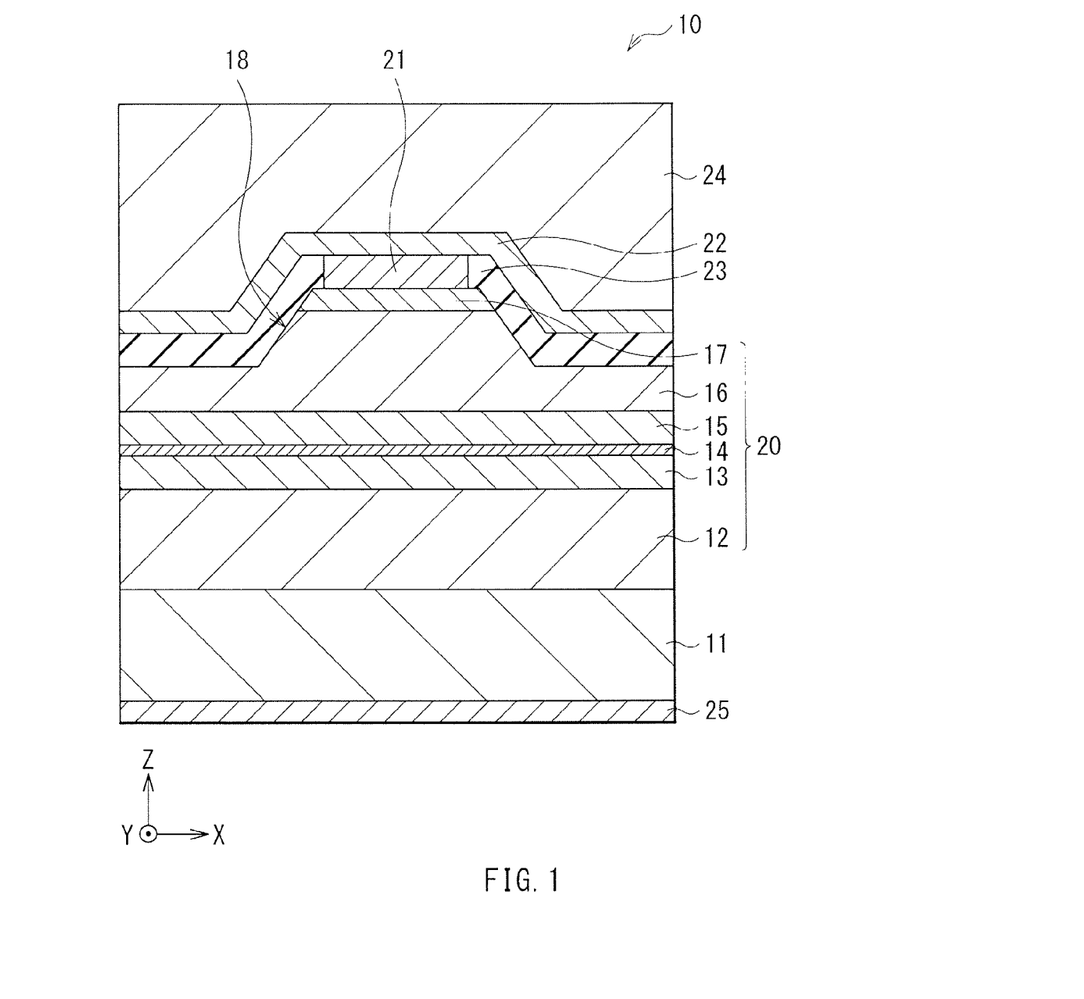
FIG. 1 is a sectional view illustrating a schematic configuration of a light-emitting unit including a semiconductor light-emitting device according to a first embodiment of the present disclosure.
Figure 2:
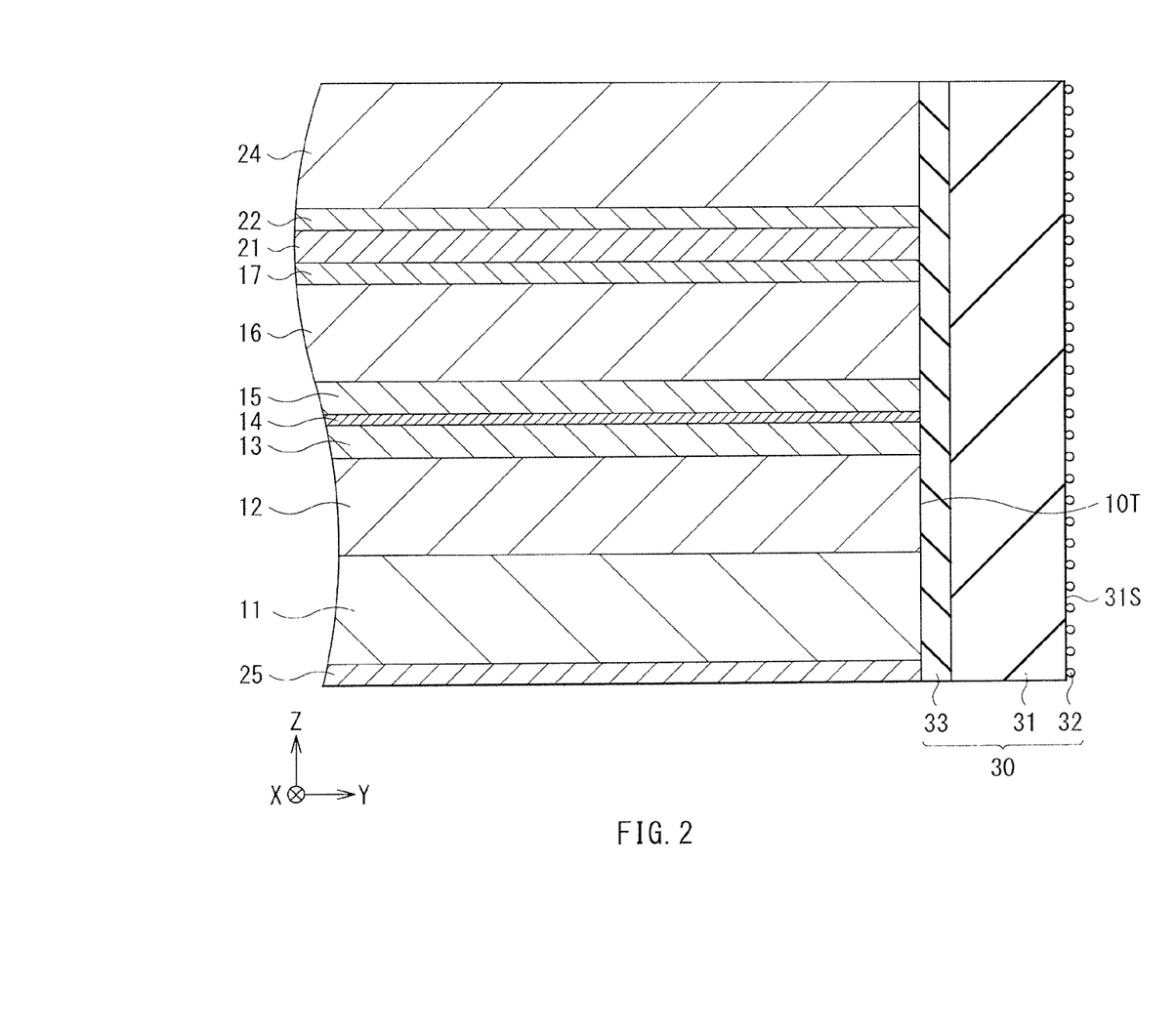
FIG. 2 is another sectional view of the light-emitting unit illustrated in FIG. 1.

FIG. 1 illustrates a sectional configuration of a light-emitting unit including a semiconductor light-emitting device (laser diode device) 10 according to an embodiment of the present disclosure. FIG. 2 illustrates a section orthogonal to a section illustrated in FIG. 1 of the light-emitting unit. More specifically, FIG. 1 illustrates a section parallel to a resonator end surface of the semiconductor light-emitting device 10, and FIG. 2 illustrates a section along a longitudinal direction of a resonator of the semiconductor light-emitting device 10.

The semiconductor light-emitting device 10 may be a device formed, for example, by growing a Group III-V nitride semiconductor layer (hereinafter simply referred to as "semiconductor layer") 20 on a substrate 11 (a nitride semiconductor substrate) made of GaN. As used herein, the term "Group III-V nitride semiconductor" refers to a gallium nitride-based compound including Ga (gallium) and N (nitrogen). Examples of the gallium nitride-based compound including Ga and N may include GaN, AlGaN (aluminum-gallium nitride) and AlGaInN (aluminum-gallium-indium nitride). Each of the gallium nitride-based compounds contains, as necessary, an n-type impurity made of any of Group IV and VI elements such as Si (silicon), Ge (germanium), O (oxygen), and Se (selenium) or a p-type impurity made of any of Group II and IV elements such as Mg (magnesium), Zn (zinc), and C (carbon).

The semiconductor layer 20 has a laser configuration (a light-emitting device configuration) configured by laminating an n-type cladding layer 12, an n-type guide layer 13, an active layer 14, a p-type guide layer 15, a p-type cladding layer 16, and a p-type contact layer 17 in order on the substrate 11. It is to be noted that a laminating direction of the semiconductor layer 20 is hereinafter referred to as "vertical direction (Z-axis direction)", an emission direction of laser light is hereinafter referred to as "axis direction (Y-axis direction)", and a direction perpendicular to the axis direction and the vertical direction is hereinafter referred to as "horizontal direction (X-axis direction)".

The n-type cladding layer 12 may be made of, for example, n-type AlGaN, and the n-type guide layer 13 may be made of, for example, n-type GaN. The active layer 14 may have, for example, an undoped GaInN multiple quantum well structure. The p-type guide layer 15 may be made of, for example, p-type GaN, the p-type cladding layer 16 may be made of, for example, AlGaN, and the p-type contact layer 17 may be made of, for example, p-type GaN.

Moreover, a part of the p-type cladding layer 16, and the p-type contact layer 17 form a strip-shaped ridge section (a projection section) 18 extending in the axis direction. A region corresponding to the ridge section 18 of the active layer 14 serves as a current injection region (a light emission region). It is to be noted that the ridge section 18 has a function of restricting the size of the current injection region of the active layer 14 as well as stably controlling a light mode in the horizontal direction to a fundamental (0th-order) mode to guide light to the axis direction.

Both side surfaces of the ridge section 18 are covered with an insulating layer 23. A p-side contact electrode layer 21 ohmically connected to the p-type contact layer 17 is formed on the p-type contact layer 17 of the ridge section 18. Moreover, a p-side pad electrode layer 22 is provided so as to cover the p-side contact electrode layer 21 and the insulating layer 23. Further, as illustrated in FIG. 2, a protective film 30 that also functions as a reflective film is formed on each of a pair of resonator end surfaces 10T parallel to a plane (an XZ plane) perpendicular to an extending direction (the axis direction) of the ridge section 18. However, in FIG. 2, one of the resonator end surfaces 10T and the protective film 30 with which the resonator end surface 10T is covered are illustrated, and the other resonator end surface 10T and the protective film 30 with which the other resonator end surface 10T is covered are not illustrated. The pair of protective films 30 differ in reflectivity from each other. Therefore, light generated in the active layer travels between the pair of protective films 30 to be amplified, and then is emitted as a laser beam from one of the protective films 30.

The protective films 30 have a function of preventing entry of water from outside and preventing deterioration of and damage to the semiconductor light-emitting device 10 in addition to the function as the reflective film. Moreover, the protective films 30 also have a function as a heat dissipation layer that is configured to dissipate heat during an operation in the semiconductor light-emitting device 10 to outside.

Each of the protective films 30 includes an aluminum oxide layer 31 with which the resonator end surface 10T is covered and silicon oxide 32 that is scattered on a surface 31S of the aluminum oxide layer 31. As used herein, the term "silicon oxide 32" may be represented by, for example, SiOx (0<x≤2), and may be formed, for example, by irradiating the surface 31S of the aluminum oxide layer 31 with plasma containing oxygen (O) and silicon (Si). The silicon oxide 32 may exist as microparticles with an outside diameter of ten-odd nm or less. Each of the microparticles may be isolated from other microparticles, or may be in close contact (agglomerated) with other micropatricles. Moreover, distribution density of the silicon oxide 32 on the surface 31S of the aluminum oxide layer 31 may be, for example, about $5 \times 10^{16}$ particles/cm$^2$ or less, and the silicon oxide 32 is discretely provided, and exists in a state in which the silicon oxide 32 does not form a closely packed film. However, in a case where this light-emitting unit is used as a light source in an optical disk unit for writing to and reading from a Blue-ray Disc (registered trademark), the distribution density of the silicon oxide 32 may be preferably about $5 \times 10^{15}$ particles/cm$^2$ or less to suppress change in reflectivity of the aluminum oxide layer 31. Moreover, to sufficiently secure water resistance, the distribution density of the silicon oxide 32 on the surface 31S may be, for example, about $3 \times 10^{14}$ particles/cm$^2$ or more. However, as long as only a slight amount of the silicon oxide 32 exists on the surface 31S of the aluminum oxide layer 31, an effect of reducing deterioration of the aluminum oxide layer 31 is obtainable. It is to be noted that a detection limit in XPS is about $5 \times 10^{13}$ particles/cm$^2$ at the time of filing of this application.

Each of the protective film 30 may further include an intermediate layer 33 including aluminum nitride (AlN) with higher thermal conductivity between the resonator end surface 10T and the aluminum oxide layer 31.

The insulating layer 23 may be made of, for example, an insulating material such as SiO$_2$ (silicon dioxide) or SiN (silicon nitride).

The p-side contact electrode layer 21 may be in contact with the p-side contact layer 17 of the semiconductor layer 20, and may include a metal element with a relatively large work function. Moreover, the p-side contact electrode layer 21 may have a single-layer configuration, or may have a multilayer configuration. More specifically, the p-side contact electrode layer 21 may be a layer formed by laminating, for example, a Pd (palladium) layer and a Pt (platinum) layer in this order on the p-side contact layer 17.

The p-side pad electrode layer 22 may be made of, for example, a highly conductive material such as Cu (copper), and may be provided so as to cover the entire p-side contact electrode layer 21. In other words, the p-side pad electrode layer 22 may be in contact with an entire top surface of the p-side contact electrode layer 21. It is to be noted that, as long as the p-side contact electrode layer 21 and the p-side pad electrode layer 22 are configured to be electrically connected to each other, they may not be in direct contact with each other. In other words, another conductive material layer may be provided between the p-side contact electrode layer 21 and the p-side pad electrode layer 22.

A plating layer 24 made of, for example, Au is provided on the p-side pad electrode layer 22. The plating layer 24 functions as a heat dissipation layer that is configured to dissipate, to outside, heat generated in the semiconductor layer 20 when the semiconductor light-emitting device 10 is driven. A formation region of the plating layer 24 may coincide with a formation region of the p-side pad electrode layer 22, or only a part of the p-side pad electrode layer 22 may be covered with the formation region of the plating layer 24. Alternatively, the entire p-side pad electrode layer 22 and a region peripheral thereto may be covered with the formation region of the plating layer 24. It is to be noted that, as long as the plating layer 24 and the p-side pad electrode layer 22 are configured to be electrically connected to each other, they may not be in direct contact with each other. In other words, another conductive material layer may be provided between the plating layer 24 and the p-side pad electrode layer 22.

An n-side electrode layer 25 is provided on a back surface of the substrate 11. The n-side electrode layer 25 may have a configuration in which an alloy layer including Au and Ge (germanium), a Ni layer, and an Au layer are laminated in this order from the substrate 11.

[Method of Manufacturing Light-Emitting Unit]

The light-emitting unit including the semiconductor light-emitting device 10 with such a configuration may be manufactured by, for example, the following processes.

Figure 3A:
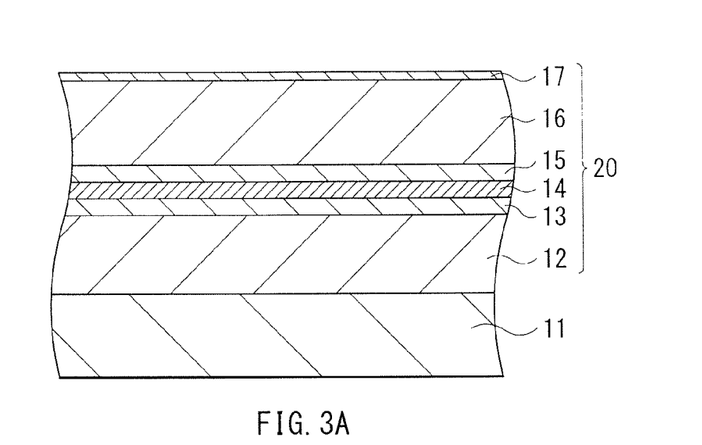
FIG. 3A is a sectional view illustrating a process for manufacturing of the semiconductor light-emitting device illustrated in FIG. 1.
Figure 3B:
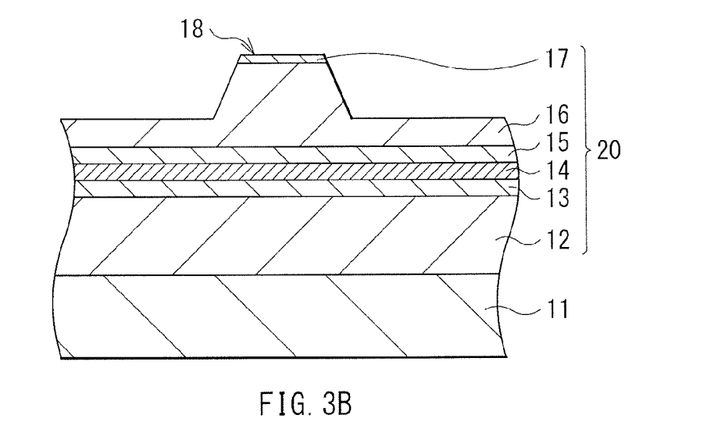
FIG. 3B is a sectional view illustrating a process following FIG. 3A.
Figure 3C:
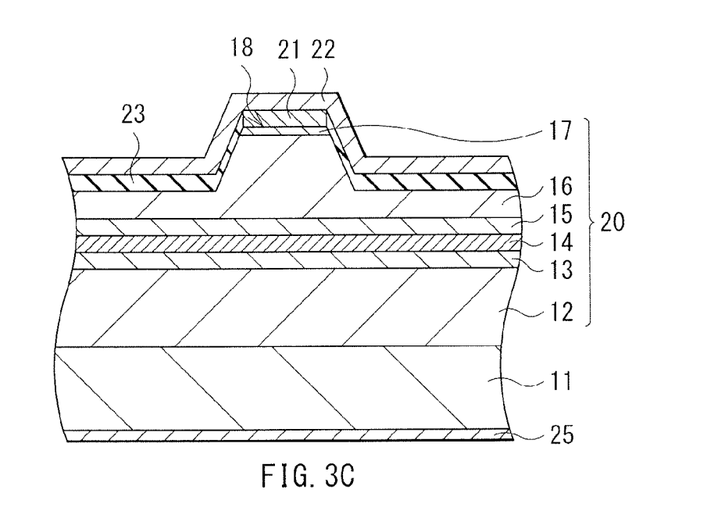
FIG. 3C is a sectional view illustrating a process following FIG. 3B.

FIGS. 3A to 3C are sectional views illustrating a method of manufacturing the semiconductor light-emitting device 10 of the light-emitting unit in order of processes. To manufacture the semiconductor light-emitting device 10, the semiconductor layer 20 is formed on the substrate 10 by, for example, a MOCVD method. At this time, as a material of the GaN-based compound semiconductor, for example, trimethylaluminum (TMA), trimethylgallium (TMG), trimethylindium (TMIn), or ammonia (NH$_3$) may be used. As a material of a donor impurity, for example, hydrogen selenide (H$_2$Se) may be used, and as a material of an acceptor impurity, for example, dimethylzinc (DMZn) may be used.

More specifically, first, as illustrated in FIG. 3A, the n-type cladding layer 12, the n-type guide layer 13, the active layer 14, the p-type guide layer 15, the p-type cladding layer 16, and the p-type contact layer 17 are laminated in this order on the substrate 11.

Next, for example, a mask layer (not illustrated) is selectively formed on the p-type contact layer 17. After that, a whole of the p-type contact layer 17 and a part of the p-type cladding layer 16 in an exposed region that is not covered with the mask layer are removed by a reactive ion etching (RIE) method. After that, the mask layer is removed. Thus, as illustrated in FIG. 3B, the strip-shaped ridge section 18 extending in the axis direction is formed in an upper portion of the semiconductor layer 20.

Next, as illustrated in FIG. 3C, an insulating film is formed on a surface of the semiconductor layer 20, and then, lithography processing and etching processing are performed on the insulating film to form the insulating layer 23 that has an opening on the p-type contact layer 17 of the ridge section 18. After that, the p-side contact electrode layer 21 is formed so as to be embedded in the opening of the insulating layer 23. Moreover, lithography processing, etching processing, and lift-off processing are performed to form the p-side pad electrode layer 22 so as to cover the p-side contact electrode layer 21. Further, for example, the back surface of the substrate 11 is wrapped to adjust a thickness of the substrate 11, and then the n-side electrode layer 25 is formed by performing lithography processing, etching processing, and lift-off processing. Furthermore, the plating layer 24 is formed with use of a plating method such as an electrolytic plating method so as to cover the p-side pad electrode layer 22. Finally, the semiconductor light-emitting device 10 is completed by formation of reflecting mirror films (not illustrated) on a pair of end surfaces along the axis direction, or the like.

Figure 4:
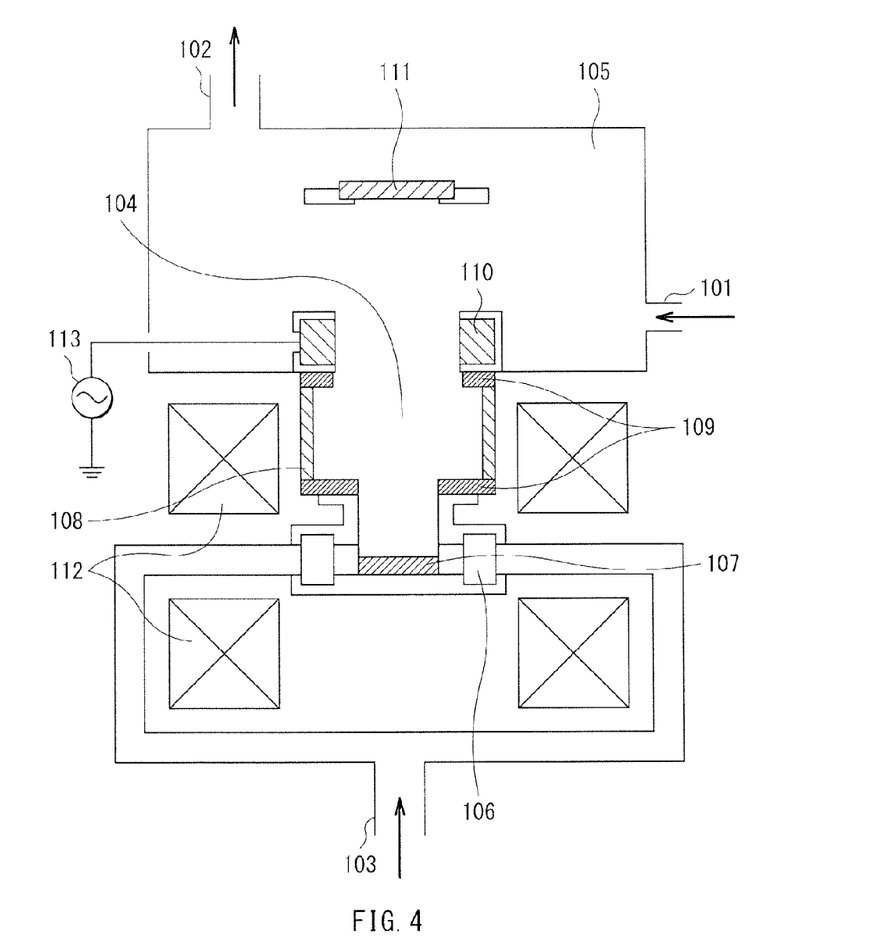
FIG. 4 is a schematic view of an ECR apparatus used to manufacture the semiconductor light-emitting device illustrated in FIG. 1.

After the semiconductor light-emitting device 10 is completed, the protective films 30 are formed on the resonator end surfaces 10T with use of an electron cyclotron resonance (ECR) plasma film formation apparatus (hereinafter simply referred to as "ECR apparatus") by the following processes.

The ECR apparatus includes a plasma chamber 104, a film formation chamber 105, a target material 110, and a plurality of magnetic coils 112. The plasma chamber 104 is a component configured to generate ECR plasma, and the magnetic coils 112 configured to generate a magnetic field are provided around the plasma chamber 104. The film formation chamber 105 is a component configured to form a film on a sample that is placed on a sample stage 111 disposed therein. The film formation chamber 105 is connected to the plasma chamber 104, and plasma generated in the plasma chamber 104 is introduced into the film formation chamber 105. Moreover, the target material 110 is held in an interior of the film formation chamber 105. The target material 110 is connected to a radio-frequency (RF) power supply 113, and a sputtering amount is controlled by the RF power supply 113. In this embodiment, as the target material 110, high-purity Al (aluminum) or Si (silicon) is used.

An inlet window 106 is provided on a side opposite to the film formation chamber 105 of the plasma chamber 104, and microwaves introduced from a microwave inlet 103 are introduced into the plasma chamber 104 through the inlet window 106. In the plasma chamber 104, ECR plasma is generated by the introduced microwaves and the magnetic field generated by the magnetic coils 112.

The film formation chamber 105 further includes a gas inlet 101 and an exhaust outlet 102. Air in the film formation chamber 105 is exhausted through the exhaust outlet 102, and Ar (argon) gas, $N_2$ (nitrogen) gas, and $O_2$ (oxygen) gas are allowed to be introduced into the film formation chamber 105 through the gas inlet 101. The sample stage 111 is disposed in a position facing the plasma chamber 104 in the interior of the film formation chamber 105. The semiconductor light-emitting device 10 primarily cleaved is held so as to allow the resonator end surface 10T thereof to face the plasma chamber 104. An inner wall surface of the plasma chamber 104 is covered with a member made of quartz so as to be protected from ECR plasma. More specifically, as the quartz member with which the inner wall surface of the plasma chamber 104 is covered, an end plate 107, an inner tube 108, and a window plate 109 are provided.

It is to be noted that a process of cleaning the resonator end surface 10T may be preferably executed by performing plasma cleaning with use of Ar gas before forming the protective film 30. The cleaning process is performed only by plasma irradiation in a state in which a bias voltage is not applied to the target material 110 in the ECR apparatus. In other words, the cleaning process is allowed to be performed by generating plasma in a non-bias state. It is to be noted that the cleaning process may be performed with use of not Ar gas but a mixture of Ar gas and $N_2$ gas.

Next, a method of manufacturing the protective films 30 on the resonator end surfaces 10T by the ECR apparatus will be described in detail below.

First, the target material 110 made of high-purity Al is placed. Next, Ar gas and $N_2$ gas are introduced into the film formation chamber 105 to generate mixed plasma of argon and nitrogen. The intermediate layer 33 made of AlN (aluminum nitride) is deposited on the resonator end surface 10T of the semiconductor light-emitting device 10 by applying a predetermined vias voltage to the target material 110 in that state.

After the intermediate layer 33 is formed, Ar gas and $O_2$ gas are introduced into the film formation chamber 105 to generate mixed plasma of argon and oxygen. The aluminum oxide layer 31 made of AlO is deposited on the intermediate layer 33 that is made of AlN and covers the resonator end surface 10T by applying a predetermined bias voltage to the target material 110 in that state.

After that, after the target material 110 made of high-purity Si is placed, mixed plasma of argon and oxygen is generated in the interior of the film formation chamber 105. A slight amount of Si is introduced into the film formation chamber 105 by applying a predetermined bias voltage to the target material 110 in that state. Thus, desired irradiation plasma is obtained, and the surface 31S of the aluminum oxide layer 31 is irradiated with the irradiation plasma over a predetermined time period to form the silicon oxide 32. At this time, irradiation time for application of the irradiation plasma to the surface 31S, or the like is changed to adjust the distribution density of the silicon oxide 32 to predetermined distribution density.

[Functions and Effects of Light-Emitting Unit]

In the semiconductor light-emitting device 10 of the light-emitting unit, when a predetermined voltage is applied between the p-side contact electrode layer 21 of the ridge section 18 and the n-side electrode layer 25, a current confined by the ridge section 18 is injected into a current injection region (a light emission region). Therefore, light is emitted by recombination of electrons and holes. This light is reflected by the pair of protective films 30, and laser oscillation occurs at a wavelength at which phase change after one round-trip of the light between the protective films 30 is an integral multiple of 27c, and the light is emitted to outside as a beam.

As described above, the resonator end surfaces 10T of the semiconductor light-emitting device 10 are covered with the protective films 30 each including the intermediate layer 33, the aluminum oxide layer 31, and the silicon oxide 32. Therefore, entry of water from outside into the semiconductor light-emitting device 10 is preventable, and deterioration of and damage to the semiconductor light-emitting device 10 is preventable.

Moreover, since the silicon oxide 32 is scattered on the surface 31S of the aluminum oxide layer 31, while entry of water into the aluminum oxide layer 31 is effectively prevented, water contained in the aluminum oxide layer 31 is released to outside. Therefore, water is less likely to be localized in the interior of the aluminum oxide layer 31. Moreover, thermal conductivity of the aluminum oxide layer 31 is relatively high, compared to, for example, silicon oxide or the like, and there are gaps between places where the silicon oxide 32 are scattered; therefore, heat is efficiently dissipated from the surface 31S to outside. Therefore, heat generation during an operation in the semiconductor light-emitting device 10 is allowed to be reduced, and deterioration of the configuration of the aluminum oxide layer 31 is preventable. Further, heat of the semiconductor light-emitting device 10 is allowed to be efficiently dissipated with use of AlN as the intermediate layer 33.

Aluminum oxide may cause reaction such as change from an amorphous state to a polycrystalline state by water contained in the aluminum oxide or water entering the aluminum oxide from outside, thereby causing various kinds of deterioration accordingly. The deterioration is more pronounced with an increase in temperature. More specifically, any of phenomena such as generation of a void, change in refractive index, structural damage caused by local generation of stress by change in volume, change in extinction coefficient, and a decline in thermal conductivity may occur. However, in this embodiment, water is effectively removed by providing the above-described protective films 30, and these deterioration phenomena are allowed to be suppressed. As a result, the light-emitting unit according to this embodiment is allowed to stably provide high operation performance for a long period.

Second Embodiment

[Configuration of Optical Disk Unit]

Figure 5:
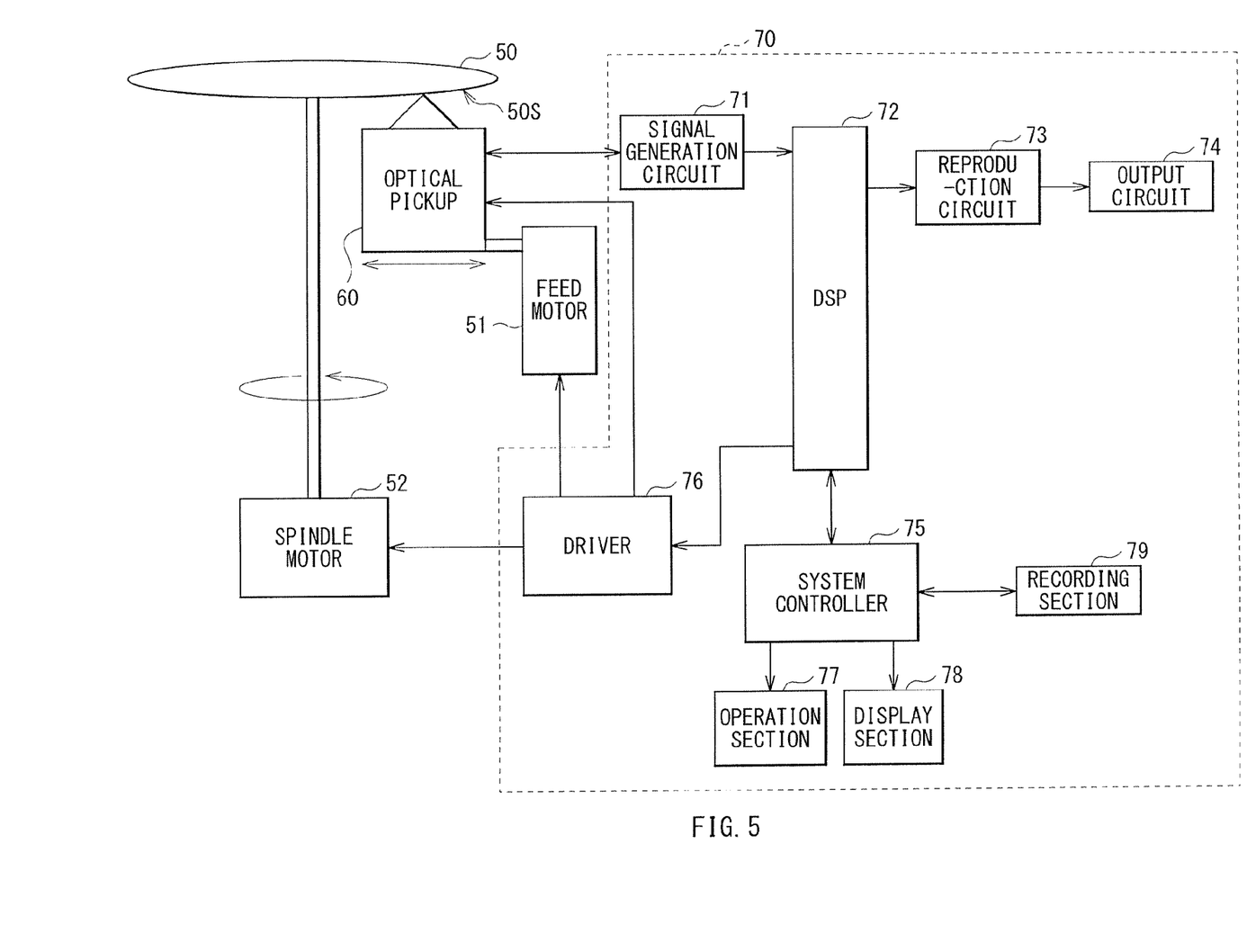
FIG. 5 is a schematic view of an optical disk unit according to a second embodiment of the present disclosure.

FIG. 5 is a schematic view of an optical disk unit according to a second embodiment of the present disclosure.

The optical disk unit includes, as a light source, the light-emitting unit including the semiconductor light-emitting device 10 described in the first embodiment. More specifically, the optical disk unit includes an optical disk 50, a feed motor 51, a spindle motor 52, an optical pickup 60, and a control section 70.

The optical disk 50 may be a Blue-ray Disc (registered trademark) or any other optical disk, and has a recording surface 50S on which various kinds of information such as audio information and image information are recorded.

The optical pickup 60 performs reading of various kinds of information such as audio information and image information recorded on the optical disk 50 by applying light beams to the optical disk 50. A light beam for CD, a light beam for DVD, and a light beam for Blue-ray disc are provided to the optical pickup 1. It is to be noted that the optical pickup 60 will be described in detail later.

The control section 70 includes a signal generation circuit 21, a DSP (Digital Signal Processor) 72, a reproduction circuit 73, an output circuit 74, a system controller 75, a driver 76, an operation section 77, a display section 78, and a recording section 79.

The signal generation circuit 71 performs arithmetic processing based on a signal obtained by a photodetector 69 (that will be described later) included in the optical pickup 60. The signal generation circuit 71 may generate, for example, various kinds of signals such as an RF signal, a focus error signal, a tracking error signal, a main push-pull signal, and a total reflection signal, and outputs the various kinds of obtained signals to the DSP 72.

The DSP 72 performs image processing based on the RF signal input from the signal generation circuit 71 to generate an image signal, and then supply the image signal to the reproduction circuit 73. The reproduction circuit 73 performs D/A conversion on the image signal to output the image signal to a monitor (not illustrated). A signal obtained by the conversion is output to an external device by the output circuit 74.

Moreover, the DSP 72 generates a servo signal based on the focus error signal or the tracking error signal input from the signal generation circuit 71. The DSP 72 may generate a tracking servo signal for performing tracking servo or a focus servo signal for performing focus servo. The generated servo signal is supplied to the driver 76. Accordingly, for example, focus control, tracking control, or the like of an objective lens 67 (that will be described later) included in the optical pickup 60 may be executed.

The system controller 75 performs control on operations of the optical pickup 60, the feed motor 51, the spindle motor 52, and the like through the DSP 72.

The system controller 75 receives information from the operation section 77, and then transmits the information to the DSP 72, and also transmits information received from the DSP 72 to the display section 78. Moreover, the system controller 75 records information that is to be used for various kinds of arithmetic operations on the recording section 79 configured of a semiconductor recording medium or the like.

The driver 76 controls driving of the optical pickup 60, the feed motor 51, and the spindle motor 52 based on the servo signal or the like supplied from the DSP 72. The feed motor 51 drives the optical pickup 60 toward a diameter direction of the optical disk 50. The spindle motor 52 drives the optical disk 50 toward a rotation direction of the optical disk 50.

[Configuration of Optical Pickup]

Figure 6:
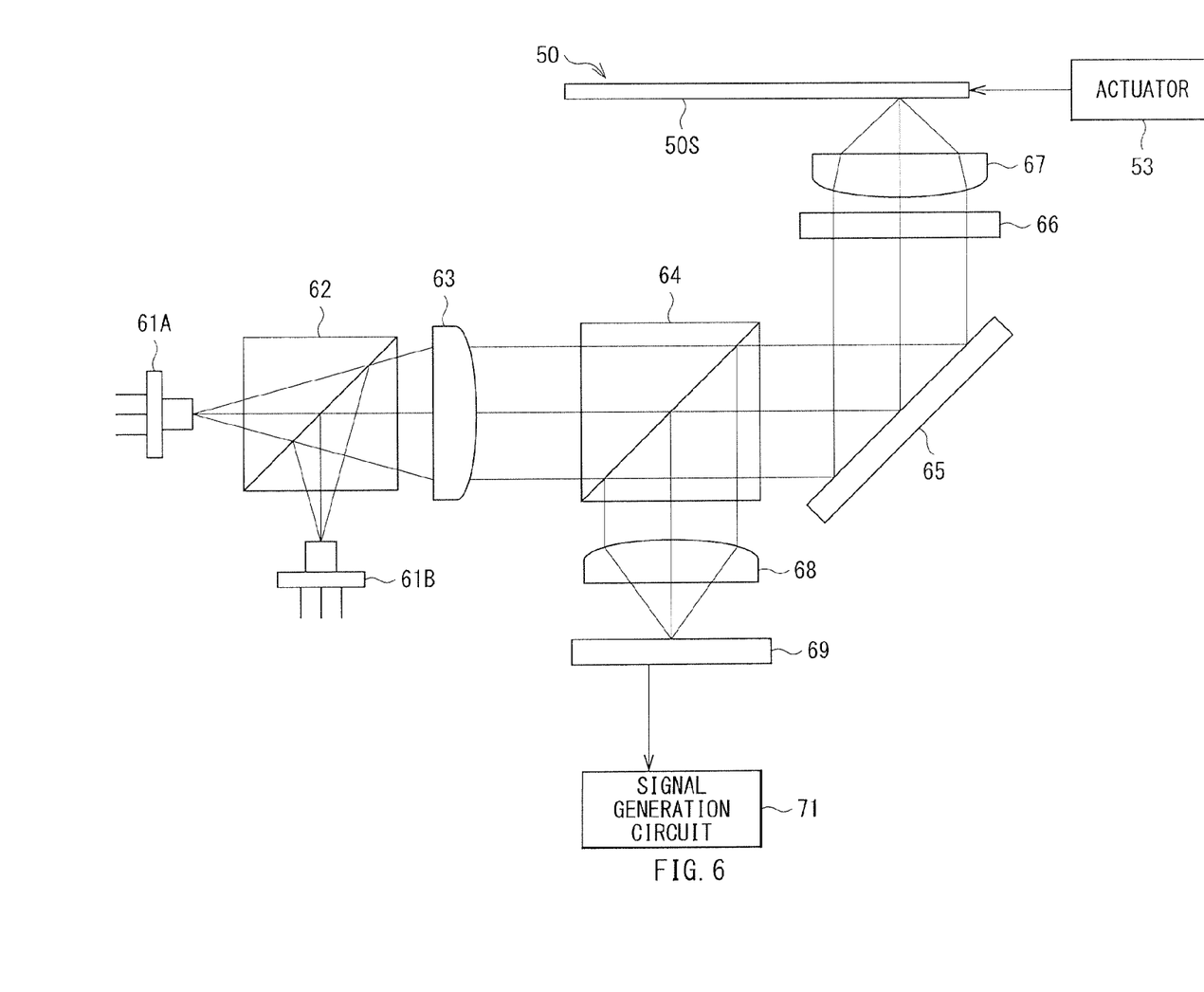
FIG. 6 is a schematic view illustrating a configuration of an optical pickup in the optical disk unit illustrated in FIG. 5.

FIG. 6 is a schematic view illustrating an optical system of the optical pickup 60.

The optical pickup 60 applies laser light to the recording surface 50S of the optical disk 50, and receives reflected light from the recording surface 50S. Thus, the optical pickup 60 reads out various kinds of information recorded on the recording surface 50S of the optical disk 50.

The optical pickup 60 includes a first light source 61A, a second light source 61B, a dichroic prism 62, a collimating lens 63, a beam splitter 64, a mirror 65, a liquid crystal optical device 66, the objective lens 67, a detection lens 68, a photodetector 69, and an actuator 53.

The semiconductor light-emitting device 10 described in the above first embodiment is applied to each of the first light source 61A and the second light source 61B. The first light source 61A may be, for example, a laser diode capable of emitting a light beam in a 650-nm band corresponding to DVD and a light beam in a 780-nm band corresponding to CD. The second light source 61B may be a laser diode capable of emitting a light beam in a 405-nm band corresponding to Blue-ray disc.

The dichroic prism 62 allows a light beam emitted from the first light source 61A that is configured to emit the light beam for DVD to pass therethrough, and reflects a light beam emitted from the second light source 61B that is configured to emit the light beam for Blue-ray disc. Then, the dichroic prism 62 allows optical axes of the light beams emitted from the first light source 61A and the second light source 61B to be coincident with each other. The light beam having passed through the dichroic prism 62 or reflected by the dichroic prism 62 is transmitted to the collimating lens 63.

The collimating lens 63 converts the light beam having passed through the dichroic prism 62 into parallel light. As used herein, the term "parallel light" refers to light in which all optical paths in the light beams emitted from the first light source 61A and the second light source 61B are substantially parallel to the optical axis. The light beam converted into parallel light by the collimating lens 63 is transmitted to the beam splitter 64.

The beam splitter 64 functions as a light separation device configured to separate incident light beams. More specifically, the beam splitter 64 allows the light beam transmitted from the collimating lens 63 to pass therethrough and then be guided to the optical disk 50, and reflects reflected light reflected by the recording surface 50S of the optical disk 50 to guide the reflected light to the photodetector 69. The light beam having passed through the beam splitter 64 is transmitted to the mirror 65.

The mirror 65 reflects the light beam having passed through the beam splitter 64 to guide the light beam to the optical disk 50. The mirror 65 is inclined at 45° with respect to the optical axis of the light beam from the beam splitter 64, and the optical axis of the light beam reflected by the mirror 65 is substantially orthogonal to the recording surface 50S of the optical disk 50. The light beam reflected by the mirror 65 is transmitted to the liquid crystal optical device 66.

The liquid crystal optical device 66 is a device capable of controlling change in refractive index with use of a property that liquid crystal molecules change their alignment directions by application of a voltage to a liquid crystal (not illustrated) sandwiched between transparent electrodes (not illustrated) so as to control a phase of the light beam having passed through the liquid crystal optical device 66.

When the liquid crystal optical device 66 is provided, spherical aberration caused by a difference in thickness of a resin layer protecting the recording surface 50S of the optical disk 50, or the like is allowed to be corrected. The light beam having passed through the liquid crystal optical device 66 is transmitted to the objective lens 67.

The objective lens 67 condenses the light beam having passed through the liquid crystal optical device 66 on the recording surface 50S of the optical disk 50. Moreover, for example, the objective lens 67 may be movable in a vertical direction and a horizontal direction in FIG. 6 by the actuator 53, and the position of the objective lens 67 is controlled based on the focus servo signal and the tracking servo signal.

The reflected light reflected by the optical disk 50 passes through the objective lens 67 and the liquid crystal optical device 66 in order, and then is reflected by the mirror 65, and after that, the reflected light is further reflected by the beam splitter 64 to be condensed onto a light-receiving device (not illustrated) disposed on the photodetector 69 by the detection lens 68.

The photodetector 69 converts light received with use of the light-receiving device such as a photodiode into an electrical signal, and then outputs the electrical signal to the signal generation circuit 71. The photodetector 69 has four separate light reception regions, and is capable of performing photoelectric conversion independently in each of the regions to output an electrical signal.

The actuator 53 moves the objective lens 67 along, for example, the diameter direction of the optical disk 50 based on an objective lens driving signal generated in and output from the driver 76.

[Functions and Effects of Optical Disk Unit]

In this optical disk unit, the semiconductor light-emitting device 10 is used as each of the first and second light sources 61A and 61B in the optical pickup 60. Therefore, the optical disk unit is allowed to stably provide high operation performance for a long period.

Third Embodiment

[Configuration of Display Unit]

Figure 7:
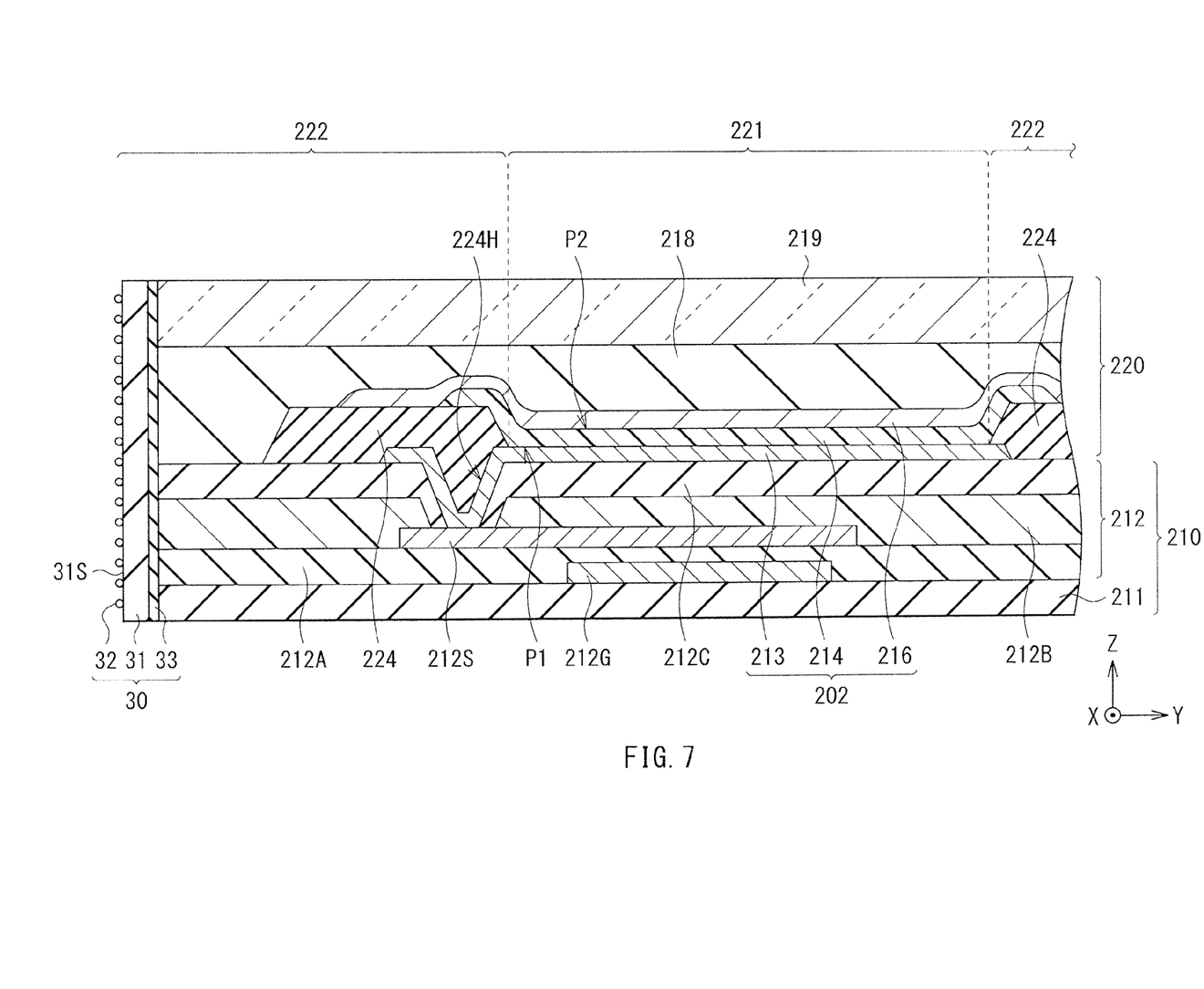
FIG. 7 is a schematic sectional view of a display unit according to a third embodiment of the present disclosure.

FIG. 7 illustrates a sectional configuration of a display unit using an organic light-emitting device 202 according to a third embodiment of the present disclosure.

The display unit is used as an ultrathin organic light-emitting color display unit or the like. In the display unit, a plurality of organic light-emitting devices 202 two-dimensionally arranged on a substrate 211 and a pixel drive circuit (not illustrated) configured to drive the organic light-emitting devices 202 are formed. The pixel drive circuit is provided to a pixel drive circuit formation layer 212 that is a hierarchical layer between the substrate 211 and the organic light-emitting device 202.

As illustrated in FIG. 7, in the display unit, a light-emitting device formation layer 220 including the plurality of organic light-emitting devices 202 is formed on a base 210 configured by providing the pixel drive circuit formation layer 212 to the substrate 211. A protective film 218 and a sealing substrate 219 are provided in order on the organic light-emitting devices 202. Each of the organic light-emitting devices 202 is configured by laminating a first electrode layer 213 as an anode electrode, an organic layer 214 including a light-emitting layer (not illustrated), and a second electrode layer 216 as a cathode electrode in this order from the substrate 211. The organic layer 214 and the first electrode layer 213 are partitioned for respective organic light-emitting devices 202 by an opening determination insulating film 224. On the other hand, the second electrode layer 216 is provided common to all of the organic light-emitting devices 202.

The opening determination insulating film 224 is provided so as to be embedded in a gap between the first electrode layers 213 and the organic layers 214 of adjacent organic light-emitting devices 202, i.e., a gap section 222 as a gap between light emission sections 221. The opening determination insulating film 224 may be made of an organic material such as polyimide, and is configured to secure insulation between the first electrode layer 213 and the second electrode layer 216 and to accurately determine the light emission sections 221 of the organic light-emitting devices 202.

The protective film 218 with which the organic light-emitting devices 202 are covered is made of an insulating material such as silicon nitride (SiNx). Moreover, the sealing substrate 219 disposed on the protective film 218 is configured to seal the organic light-emitting devices 202 together with the protective film 218 and an adhesive layer (not illustrated), and is made of a material such as transparent glass that allows light generated in the light-emitting layer to pass therethrough.

The substrate 211 is configured of glass, a silicon (Si) wafer, a resin, or the like. For example, a metal layer 211G as a gate electrode of a drive transistor (not illustrated) may be provided to a surface of the substrate 211. The metal layer 212G is covered with a gate insulating film 212A made of silicon nitride, silicon oxide, or the like. A metal layer (not illustrated) as drain wiring or a metal layer 212S as source wiring is provided to a region corresponding to the metal layer 212G on the gate insulating film 212A. The pixel drive circuit is entirely covered with a protective film (passivation film) 212B made of silicon nitride or the like, and an insulating planarization film 212C is further provided on the protective film 212B. The planarization film 212C may preferably have a surface with extremely high flatness. Moreover, an extremely small contact section 224H is provided in partial regions of the planarization film 212C and the protective film 212B. Since the planarization film 212C specifically has a larger thickness than the protective film 212B, the planarization film 212C may be preferably made of a material with high pattern precision, for example, an organic material such as polyimide. The first electrode layer 213 is embedded in the contact section 224H so as to be brought into conduction with the metal layer 212S configuring a source electrode of a drive transistor.

For example, the second electrode layer 216 may be provided common to all of the organic light-emitting devices 202, and is a transparent electrode made of a conductive material with sufficient translucency of light generated in the light-emitting layer in the organic layer 214. As the material of the second electrode layer 216, ITO or a compound including indium, zinc (Zn), and oxygen may be preferable.

[Functions and Effects of Display Unit]

In this display unit, the protective film 30 described in the above-described first embodiment is provided so as to cover end sections of the organic light-emitting devices 202. Therefore, while entry of water into the organic light-emitting devices 202 is effectively prevented, water contained in the aluminum oxide layer 31 or the organic light-emitting devices 202 is released to outside. Therefore, deterioration of the organic light-emitting devices 202 caused by water is allowed to be suppressed. Moreover, heat is efficiently dissipated from the surface 31S to outside. Therefore, heat generation during operations of the organic light-emitting devices 202 is allowed to be reduced, and deterioration of the configuration of the aluminum oxide layer 31 is preventable. As a result, the display unit according to this embodiment is allowed to stably provide high operation performance for a long period.

[Application Examples of Display Unit]

The display unit including such organic light-emitting devices 202 is allowed to be mounted to various kinds of electronic apparatuses. Examples of the electronic apparatuses may include televisions, digital cameras, notebook personal computers, portable terminal devices such as cellular phones, and video cameras. In other words, the above-described display unit is applicable to electronic apparatuses in any fields that display, as an image or a picture, an image signal input from an external device or an image signal produced inside.

Fourth Embodiment

[Configuration of Image Pickup Device]

Figure 8:
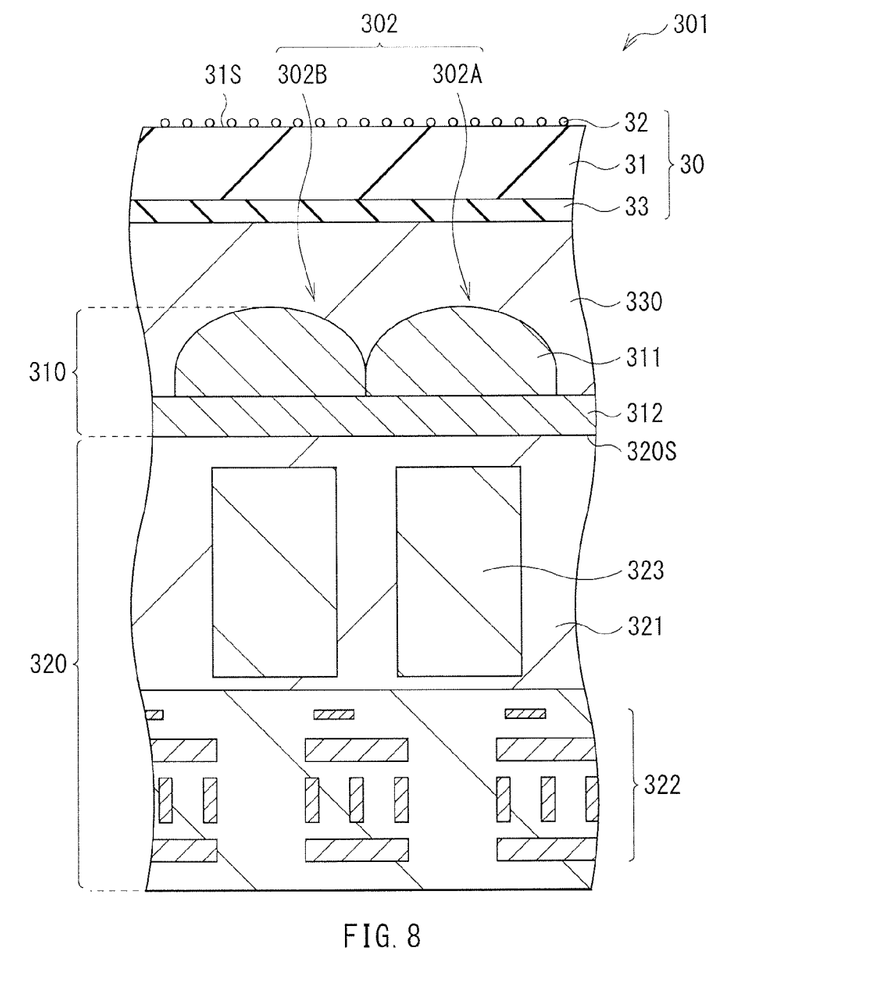
FIG. 8 is a schematic sectional view of an image pickup device according to a fourth embodiment of the present disclosure.

FIG. 8 illustrates a sectional configuration of an image pickup device (an image sensor) 301 according to a fourth embodiment of the present disclosure. The image pickup device 301 may be, for example, a back-illuminated type (back-side light reception type) solid-state image pickup device (a CCD or a CMOS). A plurality of pixels 302 are two-dimensionally arranged on a Si substrate 321 (refer to FIG. 3) in the image pickup device 301.

Each of the pixels 302 may be configured of, for example, an image pickup pixel 302A and an image plane phase difference pixel 302B. Each of the image pickup pixel 302A and the image plane phase difference pixel 302B includes a light reception section 302 including a photoelectric conversion device (a photodiode 323), and a light-condensing section 310 that is configured to condense incident light toward the light reception section 320. The image pickup pixel 302A is configured to generate a signal for image generation by performing photoelectric conversion on a subject image formed by an imaging lens in the photodiode 323. The image plane phase difference pixel 302B is configured to generate a signal for phase difference detection by dividing a pupil region of the imaging lens into pupil sub-regions and performing photoelectric conversion on subject images from the pupil sub-regions.

Respective components of each pixel 302 will be described below.

(Light-Condensing Section 310)

The light-condensing section 310 is provided on a light reception surface of the light reception section 320. The light-condensing section 310 includes, on a light incident side, an on-chip lens 311 as an optical functional layer facing the light reception section 320 of each of the pixels 302. The light-condensing section 310 further includes a color filter 312 between the on-chip lens 311 and the light reception section 320.

The on-chip lens 311 has a function of condensing light toward the light reception section 320 (more specifically, the photodiode 323 of the light reception section 320). A refractive index of the on-chip lens 311 may be, for example, from about 1.1 to 1.4. Examples of a lens material include a silicon oxide film ($SiO_2$) and the like.

The color filter 312 may be, for example, any one of a red (R) filter, a green (G) filter, a blue (B) filter, and a white (W) filter, and may be provided to each of the pixels 302. These color filters 312 are arranged in a regular color arrangement (for example, a Bayer arrangement). In the image pickup device 301, light reception data of colors corresponding to the color arrangement is obtainable by providing such color filters 312. It is to be noted that a color arrangement of the color filters 312 in the image plane phase difference pixels 302B is not specifically limited; however, the green (G) filter or the white (W) filter may be preferably used so as to allow an autofocus (AF) function to be used in a dark place with a small light amount. Moreover, when the white (W) filter is used, phase difference detection information with higher precision is obtainable.

(Light Reception Section 320)

The light reception section 320 is configured of a Si substrate 321 in which the photodiode 323 is embedded and a wiring layer 322 provided to a surface (on a side opposite to the light reception surface 320S) of the Si substrate 321. It is to be noted that transistors such as a transfer transistor, a reset transistor, and an amplification transistor and various kinds of wiring are provided to the wiring layer 322.

The photodiode 323 may be, for example, an n-type semiconductor region formed in a thickness direction of the Si substrate 321, and configures p-n junction with a p-type semiconductor region provided to a front surface and a region in proximity to a back surface of the Si substrate 21.

In the image pickup device 301, a planarization film 330 formed of a transparent material with high pattern precision, for example, an organic material such as polyimide is provided to cover all of the on-chip lenses 311. The protective film 30 described in the above-described first embodiment is provided to entirely cover the planarization film 330.

[Application Examples of Image Pickup Device]

Next, application examples of the image pickup device 301 will be described below. The image pickup device 301 is applicable to electronic apparatuses in various fields. As an example of the electronic apparatus, an image pickup unit (a camera) 3 including the image pickup device 301 will be described blow referring to FIG. 9. It is to be noted that, although not illustrated, the image pickup device 301 is allowed to be mounted in endoscopic cameras, vision chips (artificial retinas), biosensors, in-car sensors, and the like.

(Configuration of Image Pickup Unit)

Figure 9:
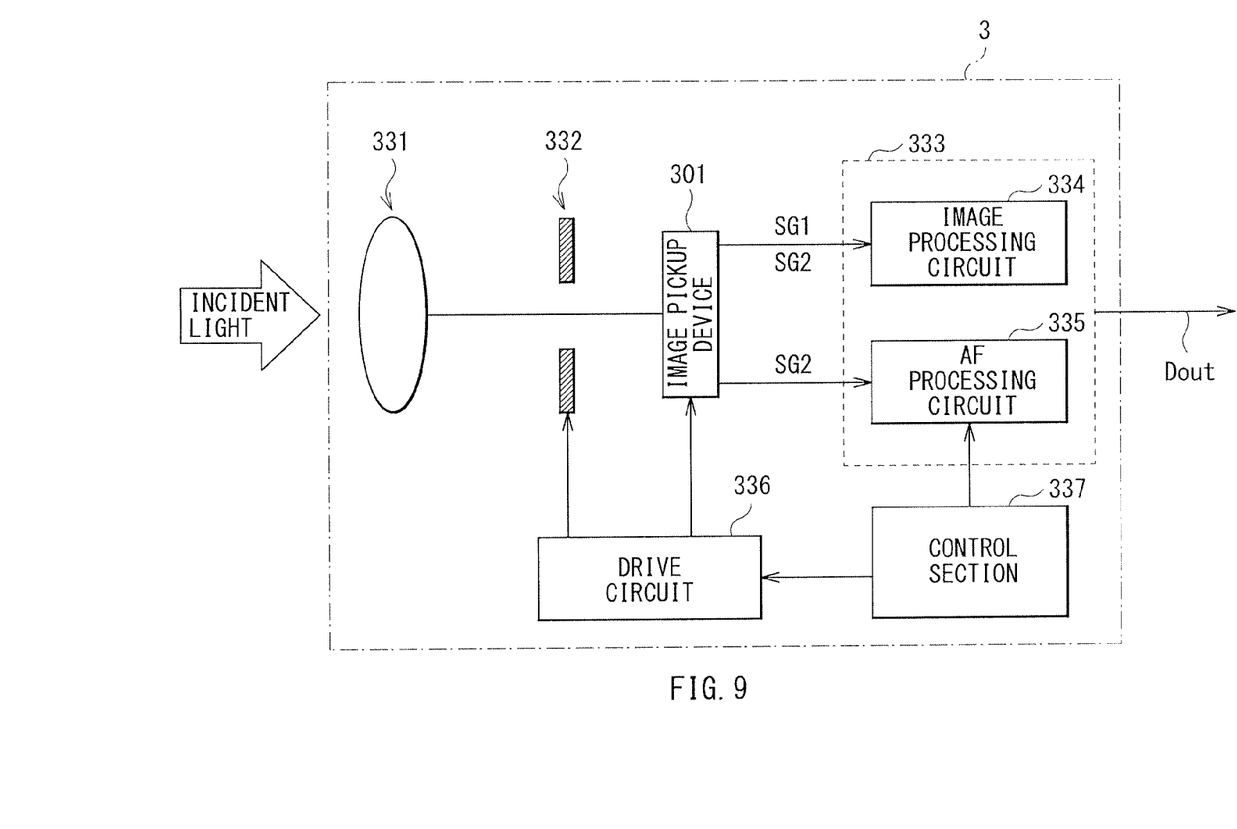
FIG. 9 is a schematic view of an image pickup unit including the image pickup device illustrated in FIG. 8.

FIG. 9 is a functional block diagram illustrating an entire configuration of the image pickup unit 3. The image pickup unit 3 may be, for example, a digital still camera or a digital video camera, and includes an optical system 331, a shutter device 332, the image pickup device 301, a signal processing circuit 333 (an image processing circuit 334 and an AF processing circuit 335), a drive circuit 336, and a control section 337.

The optical system 331 includes one or a plurality of image pickup lenses that are configured to form image light (incident light) from a subject on an image pickup plane. The shutter device 332 is configured to control a light application period (an exposure period) and a light-shielding period for the image pickup device 301. The drive circuit 336 is configured to perform an open-close drive of the shutter device 332, and to drive an exposure operation and a signal readout operation in the image pickup device 301. The signal processing circuit 333 is configured to perform predetermined signal processing, for example, various kinds of correction processing such as demosaic processing and white balance adjustment processing on output signals (SG1 and SG2) from the image pickup device 301. The control section 337 may be configured of, for example, a microcomputer, and controls a shutter drive operation and an image sensor drive operation in the drive circuit 336, and controls a signal processing operation in the signal processing circuit 333.

In the image pickup unit 3, when incident light is received by the image pickup device 301 through the optical system 331 and the shutter device 332, a signal electric charge based on an amount of the received light is accumulated in the image pickup device 301. The drive circuit 336 reads out the signal electric charge (an electrical signal SG1 obtained from the image pickup pixel 2A and an electrical signal SG2 obtained from the image plane phase difference pixel 2B) accumulated in each of the pixels 302 of the image pickup device 301. The read electrical signals SG1 and SG2 are output to the image processing circuit 334 and the AF processing circuit 335. An output signal output from the image pickup device 301 is subjected to predetermined signal processing in the signal processing circuit 333, and is output as an image signal Dout to an external device (such as a monitor), or is stored in a storage section (a storage medium) such as a memory (not illustrated).

[Functions and Effects of Image Pickup Device and Image Pickup Unit]

As described above, the protective film 30 is provided to a top section of the image pickup device 301; therefore, while entry of water into the image pickup device 301 is prevented, water contained in the aluminum oxide layer 31 or the image pickup device 301 is released to outside. Therefore, deterioration of the image pickup device 301 caused by water is allowed to be suppressed. Moreover, heat is efficiently dissipated from the surface 31S to outside. Therefore, heat generation during an operation of the image pickup device 301 is allowed to be reduced, and deterioration of the configuration of the aluminum oxide layer 31 is preventable. Favorable light-condensing characteristics are allowed to be maintained by preventing deterioration of the configuration of the aluminum oxide layer 31. Accordingly, the image pickup unit 3 according to this embodiment is allowed to stably provide high operation performance for a long period.

Although the present disclosure is described referring to some embodiments, the present disclosure is not limited to the above-described embodiments, and may be variously modified. For example, the materials, thicknesses, and the like of respective layers are not limited to those described in the above-described embodiments, and each of the layers may be configured of any other material with any other thickness.

Moreover, in the above-described embodiments, as an electronic device, the semiconductor light-emitting device, the organic light-emitting device, and the image pickup device are described as examples, and as an electronic unit including the electronic device, the light-emitting unit, the optical disk unit, the display unit, and the image pickup unit are described as examples. However, the present technology is not limited thereto. The present technology is applicable to any other electronic devices and any other electronic units.

Further, in the above-described embodiments, when the silicon oxide 32 of the protective film 30 is formed, ECR plasma is applied to the resonator end surface 10T by the ECR apparatus; however, the present technology is not limited thereto. Alternatively, RF plasma or ICP plasma may be applied. Moreover, instead of silicon oxide, an oxide of B (boron), Ge (germanium), As (arsenic), Sb (antimony), Te (tellurium), or Po (polonium) may be used.

Furthermore, in the display unit according to the above-described third embodiment, the sealing substrate 219 is provided so as to face the base 210 to which the pixel drive circuit is provided; however, the present technology is not limited thereto. For example, instead of the sealing substrate 219, the protective film 30 described in the first embodiment may be entirely formed for sealing. Thus, an improvement in water resistance and reduction in thickness and weight of the entire display unit are achievable.

It is to be noted that the present technology may have the following configurations.

(1) An electronic unit including:
an electronic device; and
a protective film including an aluminum oxide layer and silicon oxide, the aluminum oxide layer with which the electronic device is covered, and the silicon oxide being scattered on a surface of the aluminum oxide layer.

(2) The electronic unit according to (1), in which the protective film further includes an intermediate layer between the electronic device and the aluminum oxide layer, the intermediate layer including aluminum nitride.

(3) The electronic unit according to (1) or (2), in which distribution density of the silicon oxide on the surface of the aluminum oxide layer is about $5 \times 10^{16}$ particles/cm$^2$ or less.

(4) The electronic unit according to any one of (1) to (3), in which the silicon oxide is SiOx (0<x≤2).

(5) The electronic unit according to any one of (1) to (4), in which the silicon oxide is formed by applying plasma including oxygen and silicon to the surface of the aluminum oxide layer.

(6) The electronic unit according to any one of (1) to (5), in which
the electronic device is a semiconductor light-emitting device, and
a resonator end surface of the semiconductor light-emitting device is covered with the protective film as an uppermost layer.

(7) The electronic unit according to any one of (1) to (5), in which
the electronic device is an organic light-emitting device, and
an end surface of the organic light-emitting device is covered with the protective film.

(8) The electronic unit according to any one of (1) to (5), in which the electronic device is an image pickup device, and
the image pickup device is covered with the protective film as an uppermost layer.

(9) An optical disk unit including:
an optical disk having a recording surface;
a light source configured to apply irradiation light to the recording surface of the optical disk;
a photodetector configured to detect reflected light from the recording surface of the optical disk; and
a control section configured to control operations of the optical disk, the light source, and the photodetector,
in which the light source includes
a semiconductor light-emitting device having a resonator end surface configured to emit the irradiation light, and
a protective film including an aluminum oxide layer and silicon oxide, the aluminum oxide layer with which the resonator end surface of the semiconductor light-emitting device is covered, and the silicon oxide being scattered on a surface of the aluminum oxide layer.

(10) A display unit including:
a pair of substrates;
an organic light-emitting device sandwiched between the pair of substrates, and including a first electrode, an organic layer, and a second electrode in order; and
a protective film including an aluminum oxide layer and silicon oxide, the aluminum oxide layer with which an end section of the organic light-emitting device is covered, and the silicon oxide being scattered on a surface of the aluminum oxide layer.

(11) An image pickup unit including:
an image pickup device including a light reception section and a light-condensing section, the light reception section including a photoelectric conversion device, and the light-condensing section being configured to condense incident light onto the light reception section; and a protective film including an aluminum oxide layer and silicon oxide, the aluminum oxide layer with which the image pickup device is covered, and the silicon oxide being scattered on a surface of the aluminum oxide layer.

It should be understood by those skilled in the art that various modifications, combinations, sub-combinations, and alterations may occur depending on design requirements and other factors insofar as they are within the scope of the appended claims or the equivalents thereof.

What is claimed is:

1. An electronic unit comprising:
   an electronic device; and
   a protective film including an aluminum oxide layer and silicon oxide, the aluminum oxide layer covering the electronic device, the silicon oxide being scattered on a surface of the aluminum oxide layer.

2. The electronic unit according to claim 1, wherein the protective film further includes an intermediate layer between the electronic device and the aluminum oxide layer, the intermediate layer including aluminum nitride.

3. The electronic unit according to claim 1, wherein a distribution density of the silicon oxide on the surface of the aluminum oxide layer is about $5 \times 10^{16}$ particles/cm$^2$ or less.

4. The electronic unit according to claim 1, wherein the silicon oxide is SiOx ($0 < x \leq 2$).

5. The electronic unit according to claim 1, wherein the silicon oxide is formed by applying plasma including oxygen and silicon to the surface of the aluminum oxide layer.

6. The electronic unit according to claim 1, wherein:
   the electronic device is a semiconductor light-emitting device, and
   a resonator end surface of the semiconductor light-emitting device is covered with the protective film as an uppermost layer.

7. The electronic unit according to claim 1, wherein:
   the electronic device is an organic light-emitting device, and
   an end surface of the organic light-emitting device is covered with the protective film.

8. The electronic unit according to claim 1, wherein:
   the electronic device is an image pickup device, and
   the image pickup device is covered with the protective film as an uppermost layer.

9. An optical disk unit comprising:
   an optical disk having a recording surface;
   a light source configured to apply irradiation light to the recording surface of the optical disk;
   a photodetector configured to detect reflected light reflected from the recording surface of the optical disk; and
   a control section configured to control operations of the optical disk, the light source, and the photodetector,
   wherein the light source includes
   a semiconductor light-emitting device having a resonator end surface configured to emit the irradiation light, and
   a protective film including an aluminum oxide layer and silicon oxide, the aluminum oxide layer covering the resonator end surface of the semiconductor light-emitting device, the silicon oxide being scattered on a surface of the aluminum oxide layer.

10. A display unit comprising:
    a pair of substrates;
    an organic light-emitting device sandwiched between the pair of substrates, and including a first electrode, an organic layer, and a second electrode in that order; and
    a protective film including an aluminum oxide layer and silicon oxide, the aluminum oxide layer covering an end section of the organic light-emitting device, the silicon oxide being scattered on a surface of the aluminum oxide layer.

11. An image pickup unit comprising:
    an image pickup device including a light reception section and a light-condensing section, the light reception section including a photoelectric conversion device, and the light-condensing section being configured to condense incident light onto the light reception section; and
    a protective film including an aluminum oxide layer and silicon oxide, the aluminum oxide layer covering the image pickup device, the silicon oxide being scattered on a surface of the aluminum oxide layer.

* * * * *

UNITED STATES PATENT AND TRADEMARK OFFICE
CERTIFICATE OF CORRECTION

| | |
|---|---|
| PATENT NO. | : 9,153,935 B2 |
| APPLICATION NO. | : 14/327854 |
| DATED | : October 6, 2015 |
| INVENTOR(S) | : Yoshiaki Watanabe and Takayuki Kawasumi |

It is certified that error appears in the above-identified patent and that said Letters Patent is hereby corrected as shown below:

On the title page of the patent:

TITLE (54) "ELECTRONIC UNIT, OPTICAL DISK KNIT, DISPLAY UNIT, AND IMAGE PICKUP UNIT"

Should read

--ELECTRONIC UNIT, OPTICAL DISK UNIT, DISPLAY UNIT, AND IMAGE PICKUP UNIT--

Signed and Sealed this
Eighth Day of March, 2016

Michelle K. Lee
*Director of the United States Patent and Trademark Office*